United States Patent
Chang et al.

(10) Patent No.: US 7,212,413 B2
(45) Date of Patent: May 1, 2007

(54) ELECTRONIC DEVICE WITH FLEXIBLE PRINTED CIRCUIT BOARD STRUCTURE

(75) Inventors: Che-Chih Chang, Taichung (TW); Chia-Jung Wu, Dalin Township, Chiayi County (TW)

(73) Assignee: AU Optronics Corp., Hsinchu (TW)

( * ) Notice: Subject to any disclaimer, the term of this patent is extended or adjusted under 35 U.S.C. 154(b) by 330 days.

(21) Appl. No.: 10/844,084

(22) Filed: May 12, 2004

(65) Prior Publication Data
US 2005/0195578 A1 Sep. 8, 2005

(30) Foreign Application Priority Data
Mar. 4, 2004 (TW) .............................. 93105681 A

(51) Int. Cl.
*H05K 1/00* (2006.01)
(52) U.S. Cl. .................. 361/749; 361/748; 174/254; 174/255; 439/67; 439/77
(58) Field of Classification Search ........ 361/748–749; 174/254, 255, 260; 439/67, 77
See application file for complete search history.

(56) References Cited

U.S. PATENT DOCUMENTS 6,583,990 B2 *  6/2003  Serizawa et al. ........... 361/749

FOREIGN PATENT DOCUMENTS

WO     WO02087887      11/2002

OTHER PUBLICATIONS

China Office Action mailed Nov. 17, 2006.

* cited by examiner

*Primary Examiner*—Tuan Dinh
*Assistant Examiner*—Hung S. Bui
(74) *Attorney, Agent, or Firm*—Thomas, Kayden, Horstemeyer & Risley

(57) ABSTRACT

An electronic device with flexible printed circuit board structure. The electronic device includes a first flexible printed circuit board and a second flexible printed circuit board. The first flexible printed circuit board has a first bent portion. The second flexible printed circuit board has a second bent portion penetrating the first bent portion as the first and the second flexible printed circuit boards are bent simultaneously.

12 Claims, 15 Drawing Sheets

ELECTRONIC DEVICE WITH FLEXIBLE PRINTED CIRCUIT BOARD STRUCTURE

BACKGROUND OF THE INVENTION

1. Field of the Invention

The present invention relates to an electronic device, and in particular to an electronic device using flexible printed circuit boards.

2. Description of the Related Art

Flexible printed circuit boards (FPCB) have been utilized in a variety of electronic devices such as liquid crystal displays (LCDs) for electrical connection. The flexible printed circuit boards are light, bendable, and convenient for assembly, providing a compact profile.

FIG. 1A is a schematic exploded view of a conventional liquid crystal display 100'. FIG. 1B is a schematic front view of the conventional liquid crystal display 100'.

The liquid crystal display 100' comprises a front bezel 10', a panel 20', a flexible printed circuit board of panel 30', a plurality of optical films 21', a light source 40', a flexible printed circuit board of light source 50', a light guide plate 41', a reflector 43', and a rear bezel 60'. The elements 40', 41', 42', 43' are assembled to form a backlight module.

As shown in FIG. 1A, the panel 20' is sandwiched between the front and rear bezels 10' and 60'. The light source 40' is disposed above the rear bezel 60'. Signals produced from the panel 20' are transmitted by the flexible printed circuit board of panel 30' to other interfaces of the liquid crystal display. The flexible printed circuit board of panel 30' is connected to a side of the panel 20' and protrudes from the front and rear bezels 10' and 60'. The protruding portion of the flexible printed circuit board of panel 30' is an angled portion 32'. During assembly, the angled portion 32' can be bent 90° or 180° in direction B rearward to connect with other interface.

In addition, direct backlight and edge-light technologies can be employed according to the size of LCD. Here, edge-light technology for small sized LCD is used as an example. A light emitting diode (LED) acting as light source 40' is connected to the flexible printed circuit board of light source 50', providing power and transmitting signals.

LED 40' is small, and the flexible printed circuit board of light source 50' is narrow, and both are disposed between the panel 20' and the rear bezel 60'. A portion of the flexible printed circuit board of light source 50' protrudes from the front bezel 10' and the rear bezel 60' after assembly, specifically an angled portion 52'. The angled portion 52' and the angled portion 32' are connected and bent 180° to the back of the panel 20'.

The flexible printed circuit boards 30' and 50' are welded at connection points 31' and 51'.

FIG. 1C is a rear view of an assembled conventional LCD 100' with flexible printed circuit boards 30' and 50' are angled together. FIG. 1D is a side view of an assembled conventional LCD 100' with flexible printed circuit boards 30' and 50' are angled together, in which the dashed line represents the original positions of flexible printed circuit boards 30' and 50' before bending.

The flexible printed circuit boards 30' and 50', of different lengths, are connected and fixed at the connection points 31' and 51'. When angled, since the thickness of the panel 20' is about 0.63 mm, the angled portions 32' and 52' experience different radii of curvature.

Thus, when bending toward the back of the panel 20', because the angled portions 32' and 52' are fixed at the connection points 31' and 51', the flexible printed circuit board of light source 50' is constrained and surrounded by the flexible printed circuit board of panel 30' with a larger radius of curvature. It is shown that the flexible printed circuit board of light source 50' is squeezed into the limited space surrounded by flexible printed circuit board 30'. The flexible printed circuit board 50' is deformed accordingly.

In addition to deformation, the connection points 31' and 51' may be separated by strain and stress on angled portions. If the flexible printed circuit boards are separated during assembly, process is interrupted and materials wasted, increasing assembly time and manufacturing costs.

SUMMARY OF THE INVENTION

Thus, an object of the invention is to provide an electronic device with flexible printed circuit board structure preventing stress concentration and deformation during connection.

The present invention provides an electronic device including a first flexible printed circuit board and a second flexible printed circuit board. The first flexible printed circuit board has a first bent portion. The second flexible printed circuit board has a second bent portion penetrating the first bent portion.

In one embodiment, the electronic device is a liquid crystal device in which a first bent portion defines an opening allowing passage of the second bent portion therethrough. The liquid crystal device comprises a panel contacting the first bent portion and a light source contacting the second bent portion.

In another embodiment, the electronic device is a liquid crystal device. The first bent portion defines an opening allowing the second bent portion passing therethrough. The liquid crystal device comprises a panel contacting the second bent portion and a light source contacting the first bent portion.

Accordingly, the second bent portion comprises a cantilever, bent and passing through the opening of the first bent portion.

In another embodiment, the first bent portion defines an opening allowing passage of the second bent portion therethrough. The second flexible printed circuit board further defines a hole through which the first bent portion and the second bent portion simultaneously pass.

Accordingly, the liquid crystal display comprises a panel contacting the second flexible printed circuit board.

In another embodiment, the first bent portion defines a notch allowing passage of the second bent portion therethrough. The electronic device, a liquid crystal display, further comprises a panel contacting the first bent portion and a light source contacting the second bent portion.

Accordingly, the liquid crystal display further comprises a panel contacting the first bent portion and a light source contacting the second bent portion.

The present invention also provides a flexible printed circuit board structure including a first flexible printed circuit board and a second flexible printed circuit board. The first flexible printed circuit board has a first bent portion and a first connection point. The second flexible printed circuit board has a second bent portion penetrating the first bent portion and a second connection point, connected to the first connection point.

Accordingly, the first bent portion defines an opening allowing passage of the second bent portion therethrough.

The second bent portion comprises a cantilever, bent and passing through the opening of the first bent portion.

The second flexible printed circuit board further defines a hole through which the first bent portion and the second bent portion simultaneously pass.

Accordingly, the first bent portion defines a notch allowing passage of the second bent portion therethrough.

The connecting structure is utilized in a liquid crystal display comprising a panel and a light source; the first flexible circuit board connects with the panel, and the second flexible circuit board connects with the light source.

In another embodiment, the first flexible circuit board connects with the light source, and the second flexible circuit board connects with the panel.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

First Embodiment

Figure 1A:
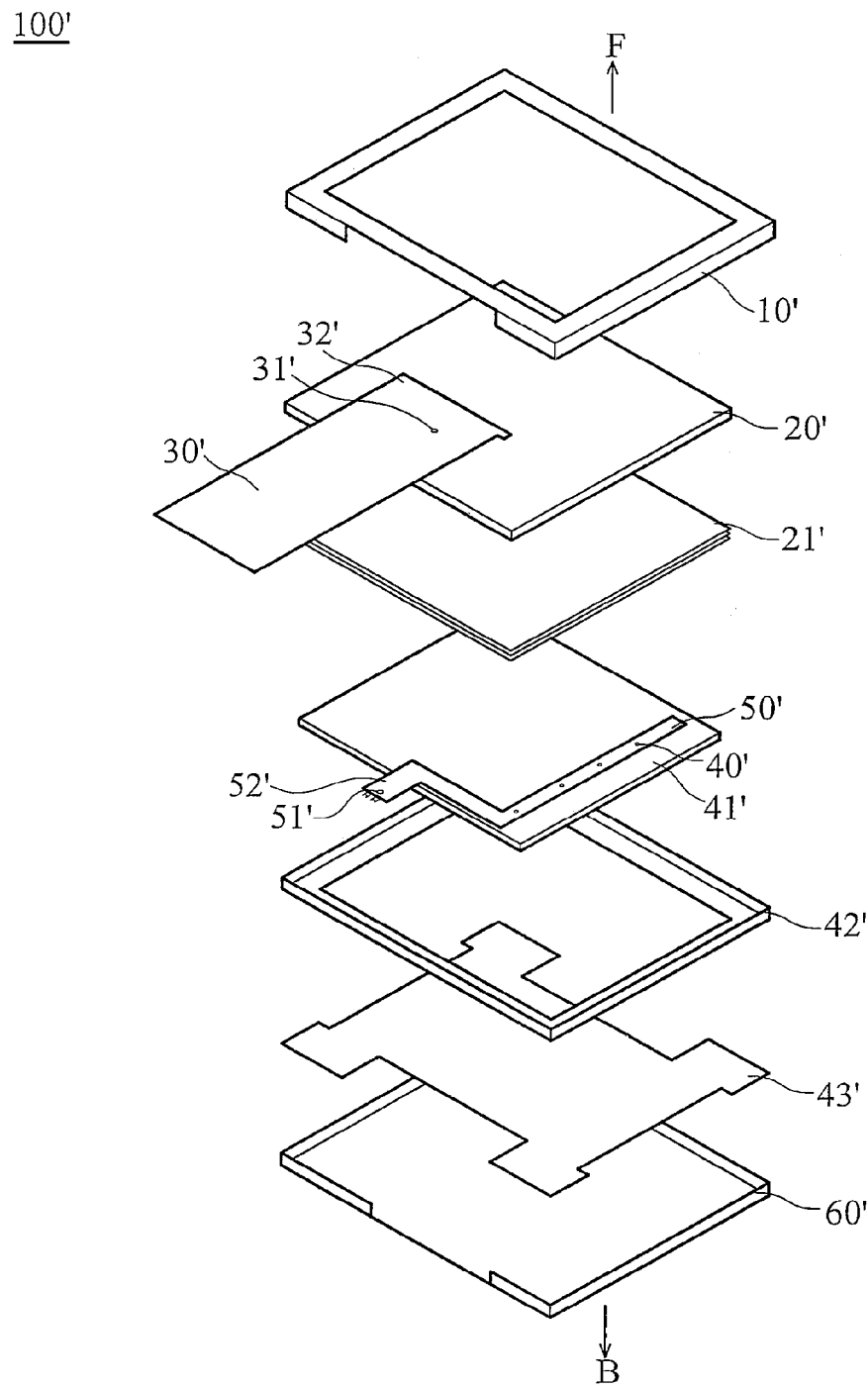
FIG. 1A is a schematic exploded view of a conventional liquid crystal display.
Figure 1B:
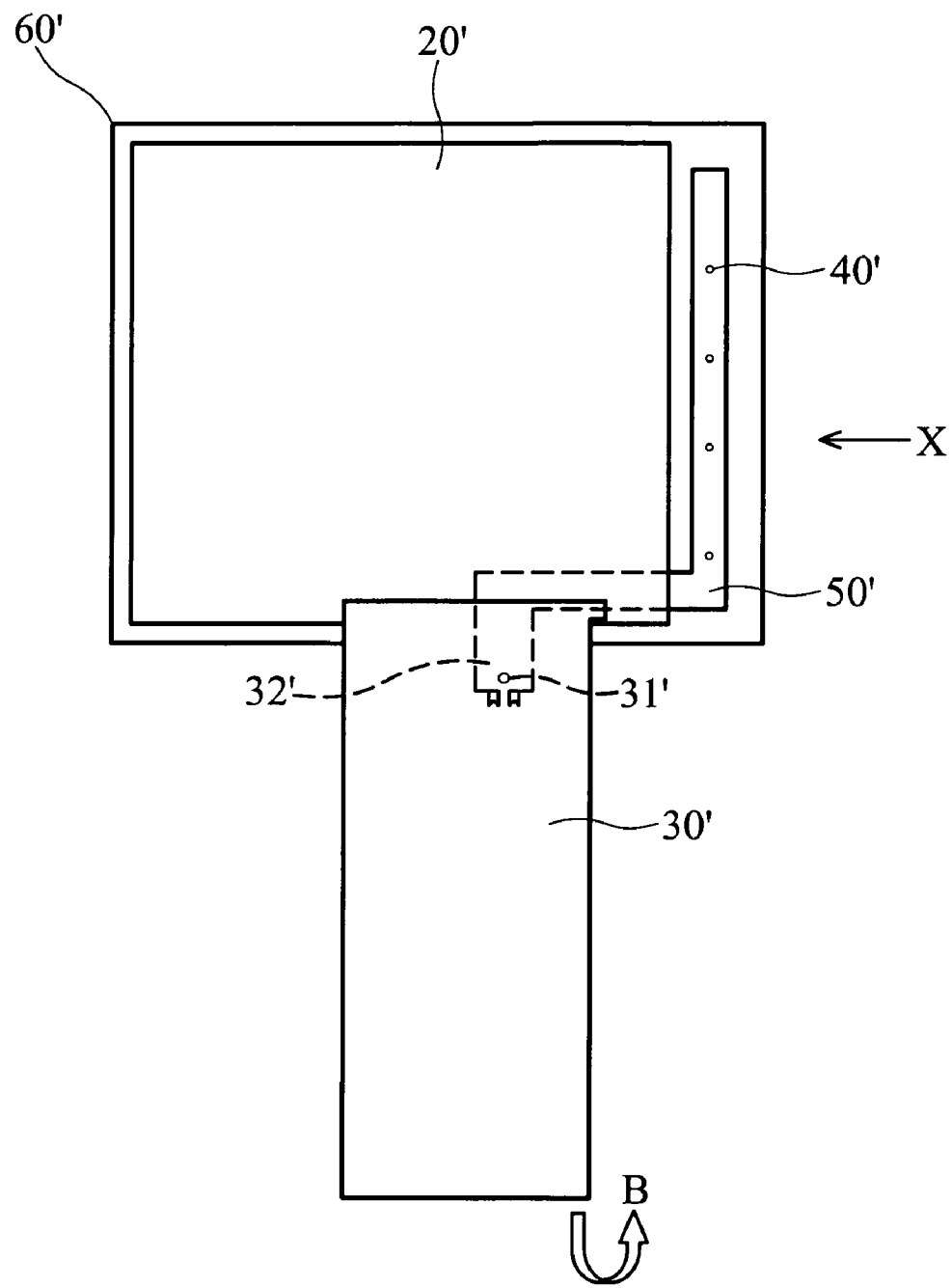
FIG. 1B is a schematic front view of a conventional liquid crystal display.
Figure 1C:
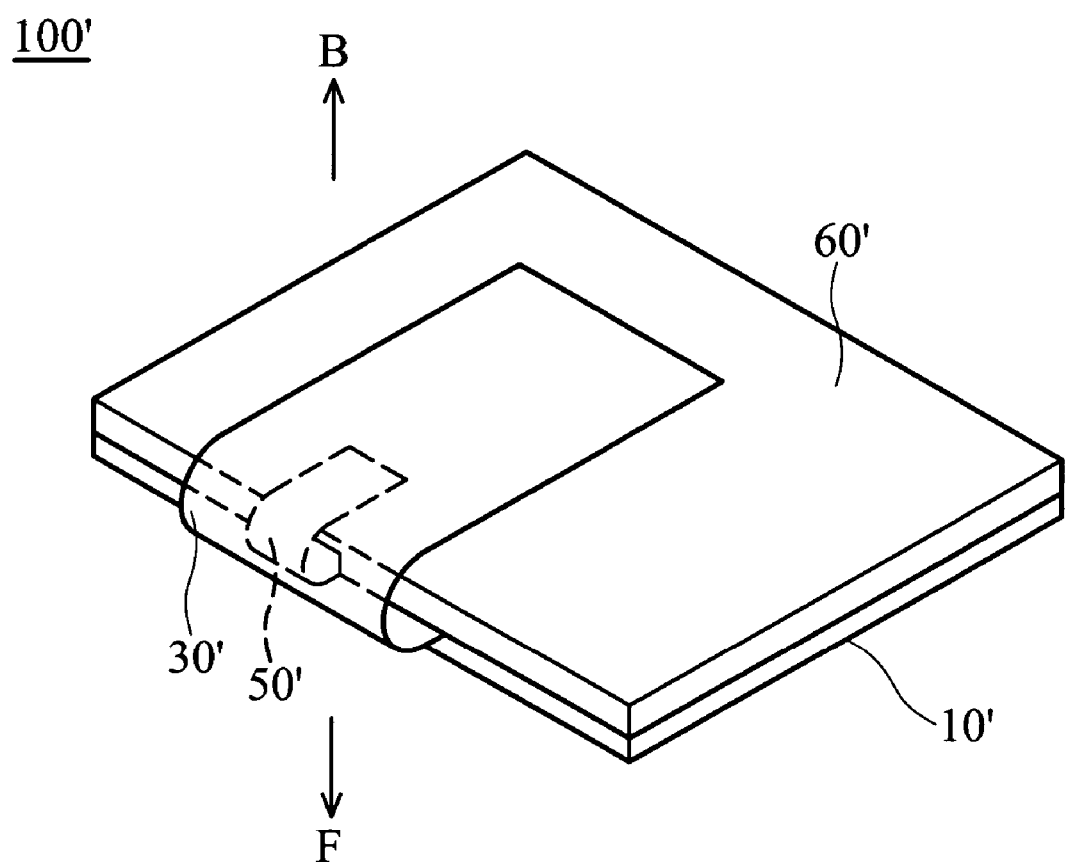
FIG. 1C is a rear view of an assembled conventional LCD with two flexible printed circuit boards connected and bent together.
Figure 1D:
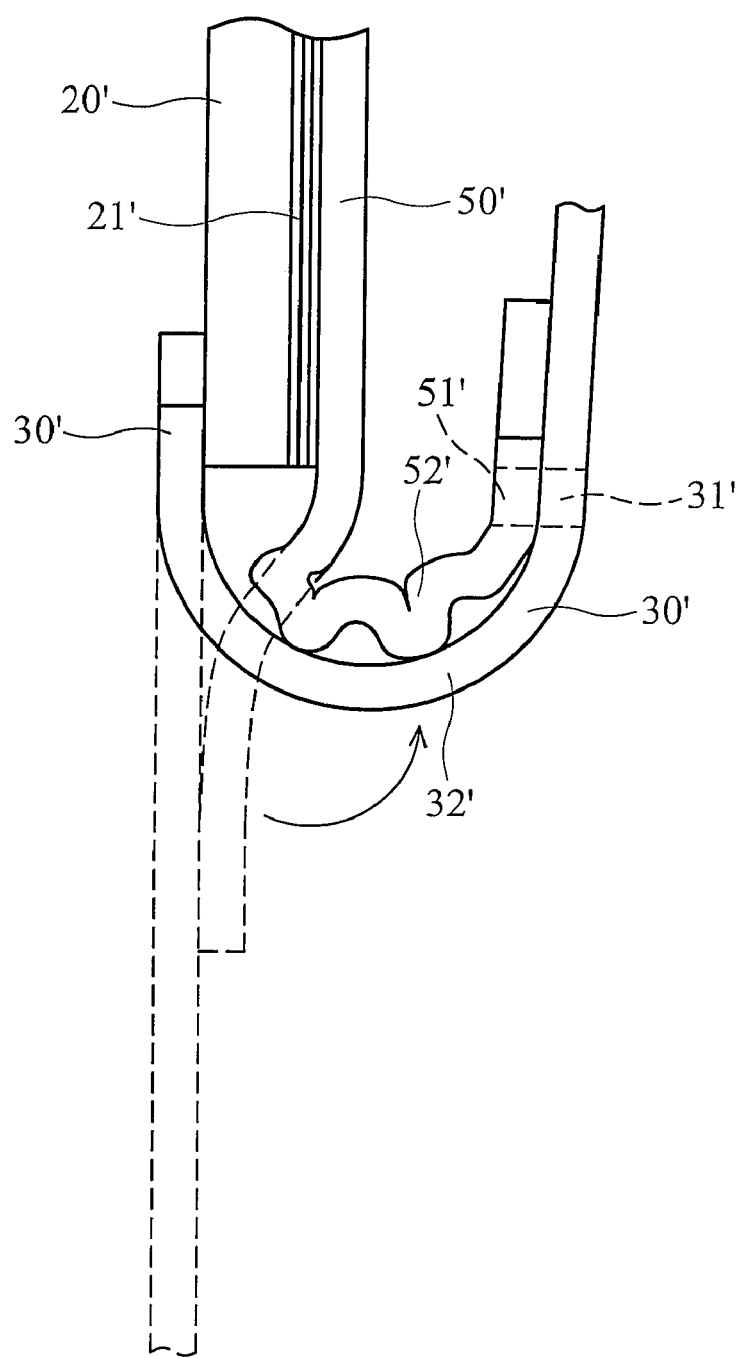
FIG. 1D is a side view of an assembled conventional LCD from a direction X of FIG. 1B when two flexible printed circuit boards angled together.
Figure 2A:
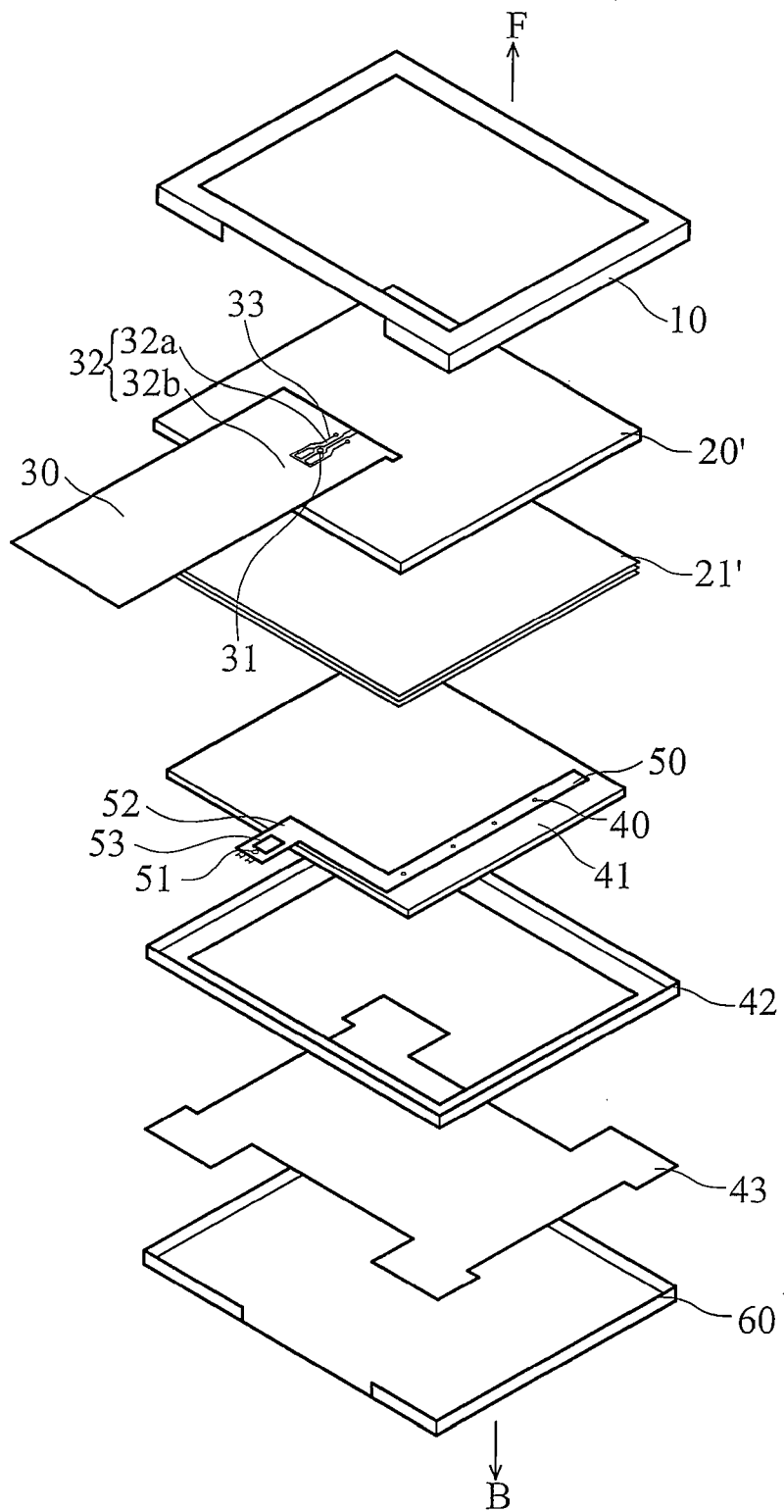
FIG. 2A is a schematic exploded view of an electronic device according to a first embodiment of the present invention.
Figure 2B:
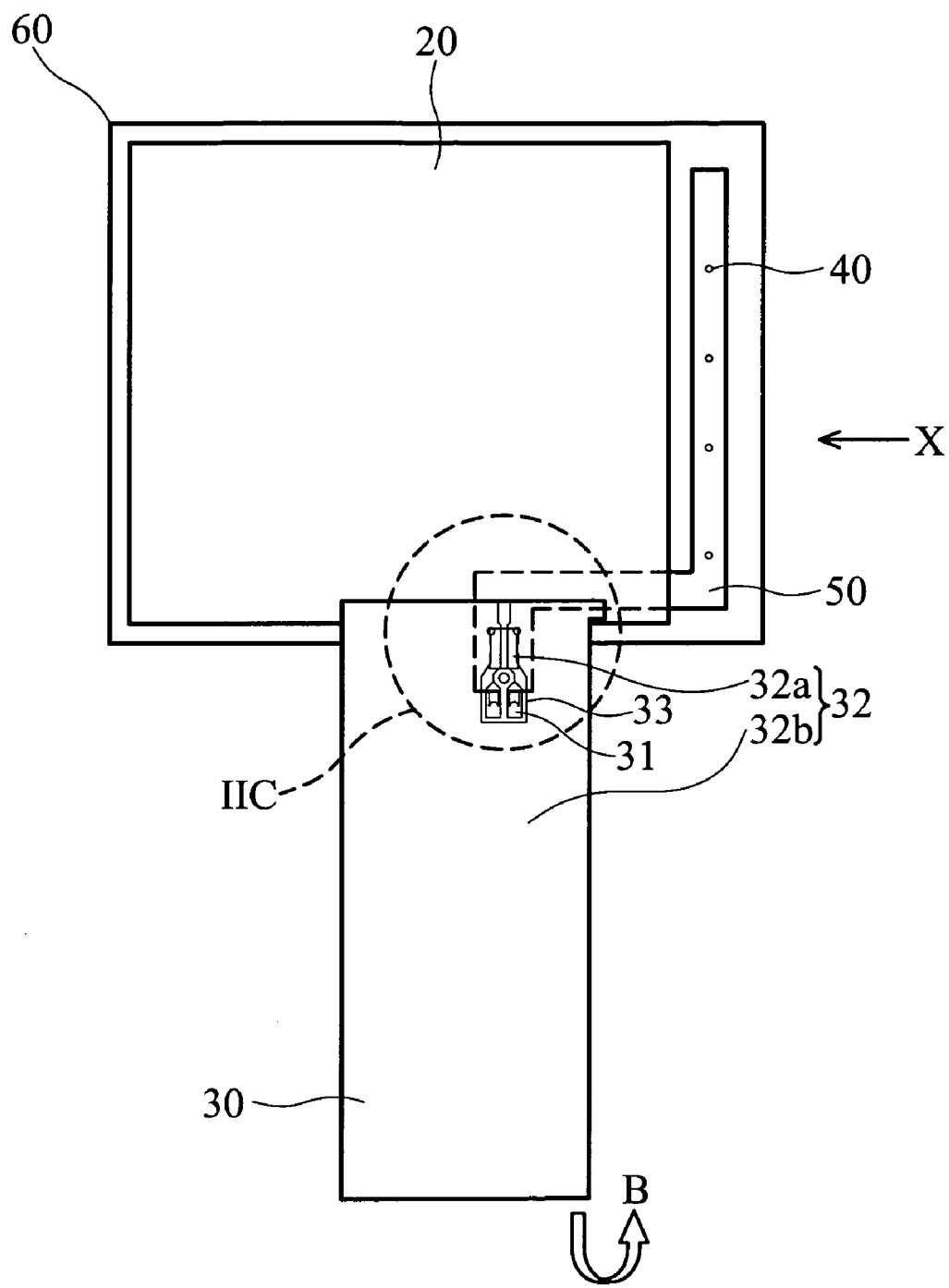
FIG. 2B is a front view of the electronic device according to the first embodiment of the present invention.

FIG. 2A is a schematic exploded view of an electronic device 100 according to a first embodiment of the present invention. FIG. 2B is a front view of the electronic device 100. A front bezel 10 and other unrelated elements are omitted to clearly show the connection between the flexible printed circuit boards 30 and 50.

As shown in FIGS. 2A and 2B, the liquid crystal display 100 comprises a front bezel 10, a panel 20, a plurality of optical films 21, a light source 40, a first flexible printed circuit board 50, a second flexible printed circuit board 30, a light guide plate 41, a plastic frame 42, a reflective sheet 43, and a rear bezel 60.

The light source 40 is a light emitting diode (LED). The first flexible printed circuit board 50 is connected to the light source 40. The second flexible printed circuit board 30 is connected to the panel 20.

The first flexible printed circuit board 50 comprises a first bent portion 52, a first connection point 51, and an opening 53. The second flexible printed circuit board 30 comprises a second bent portion 32 and a second connection point 31.

Figure 2C:
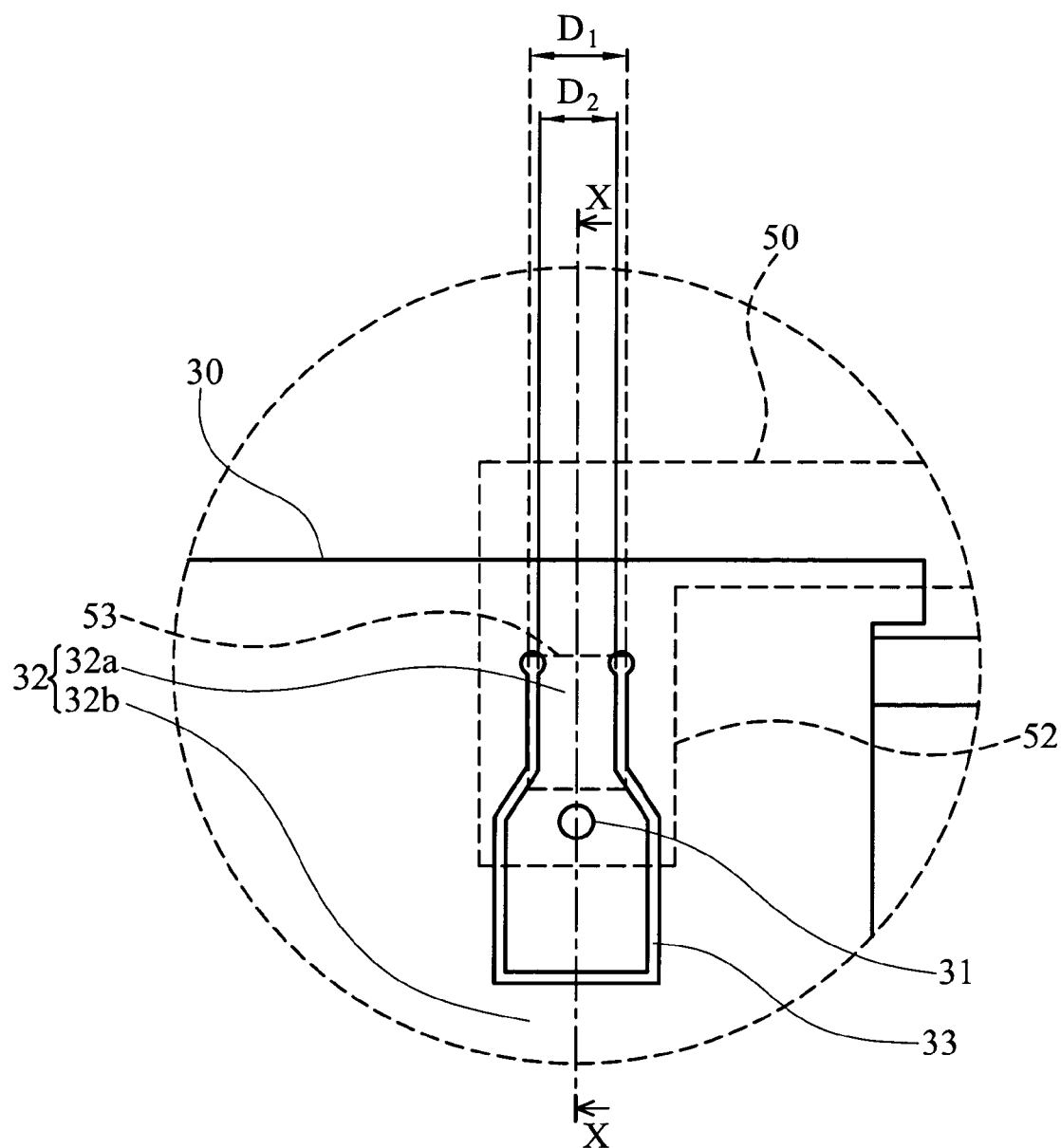
FIG. 2C is a local enlarged view of FIG. 2B according to the present invention.

FIG. 2C is a local enlarged view of the first and second flexible printed circuit boards 50, 30. The second bent portion 32 of the second flexible printed circuit board 30 comprises a cantilever 32a and a main body 32b. The cantilever 32a is formed by slitting along a predetermined path 33 on the second flexible printed circuit board 30. Finally, the cantilever 32a is bent 180° to the back of the panel 20.

The cantilever 32a corresponding to the opening 53 has a width $D_2$ less than $D_1$ of the opening 53 of the first flexible printed circuit board 50. As a result, when the first and second bent portion 52 and 32 are simultaneously bent 180 degrees, the cantilever 32a is able to pass through the opening 53 of the first bent portion 50.

Figure 2D:
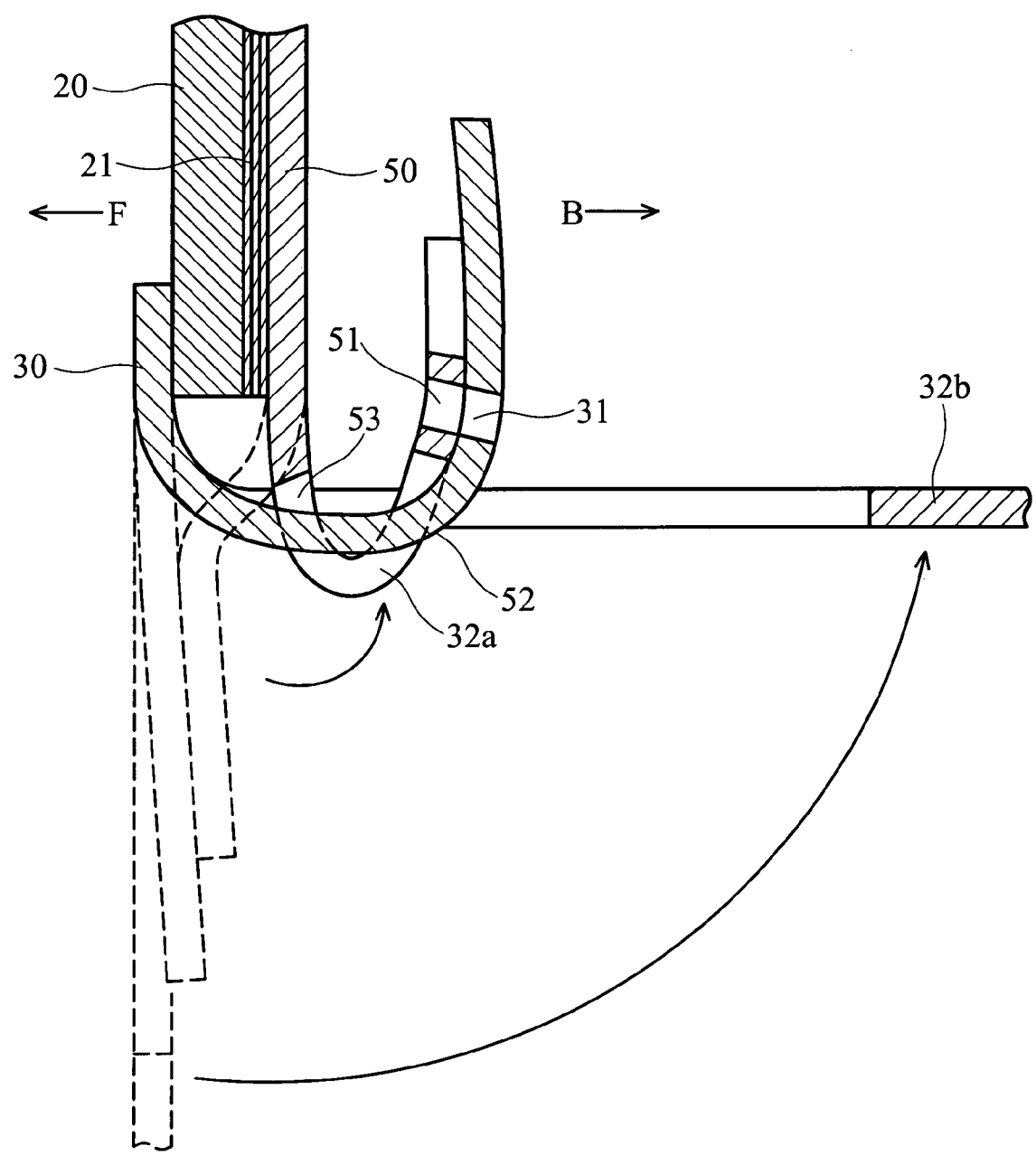
FIG. 2D is a cross section of a panel and two flexible printed circuit boards along line XX of FIG. 2C according to the present invention.

FIG. 2D is a cross section of the panel 20 and two flexible printed circuit boards 50 and 30 along line XX of FIG. 2C according to the present invention. The front and rear bezels 10 and 60 are also omitted here.

When assembled in the front and rear bezels, disposed on each side of the panel 20, the flexible printed circuit boards 50 and 30 are connected via the first and the second connection points 51 and 31. The dashed lines in FIG. 2D represent the original shape of the flexible printed circuit boards 50 and 30 before bending. The solid lines represent the flexible printed circuit boards 50 and 30 after bending 180 degrees to the back of the panel 20. When bent together, the second bent portion 32 passes through the opening 53 of the first bent portion 52. As a result, the first bent portion 52 and the second bent portion 32 do not interfere with each other, reducing stress and strain during bending.

Figure 2E:
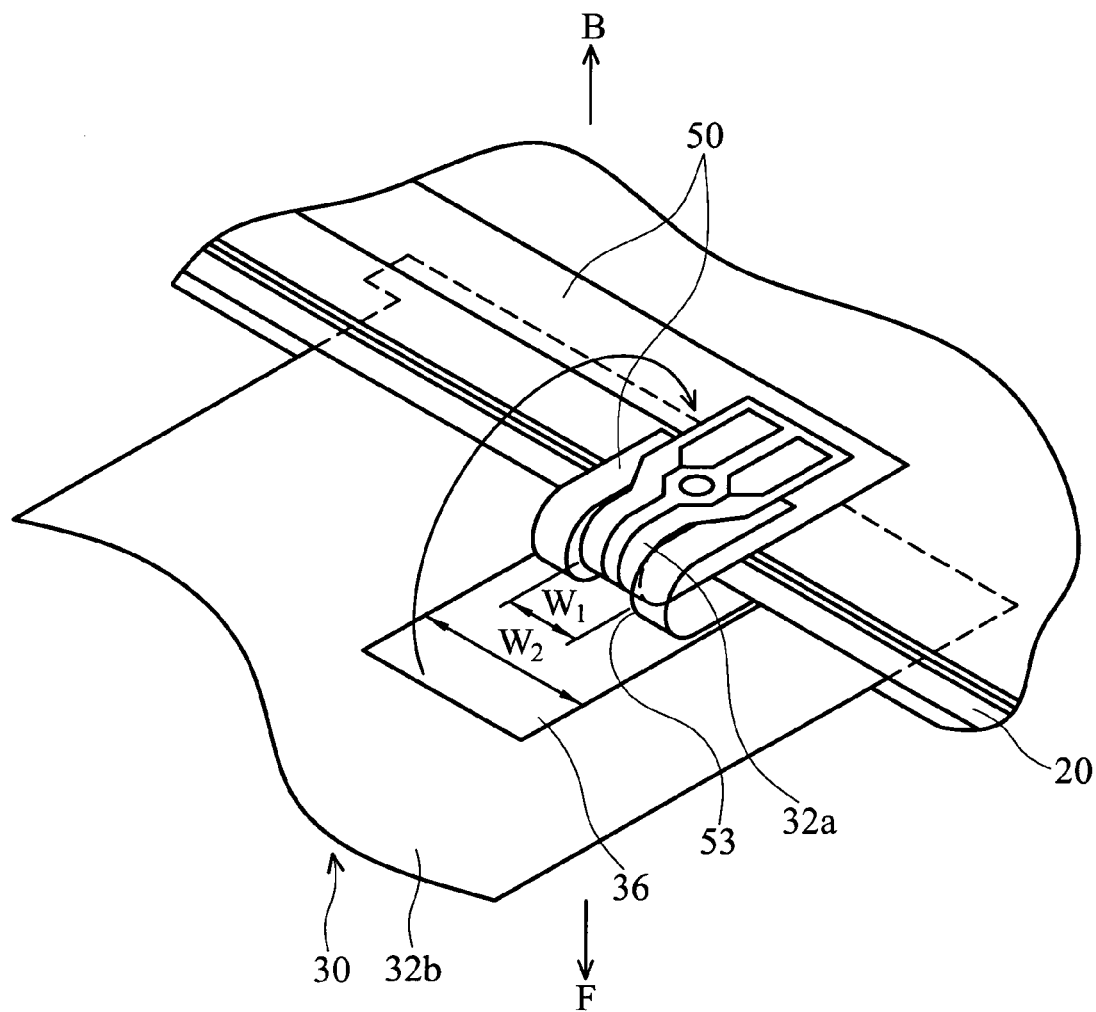
FIG. 2E is a rear view of two flexible printed circuit boards angled in direction B of FIG. 2A.

In a variation, if the main body 32b of the second flexible printed circuit board 30 is further required to be bent 90 degrees in direction B, connecting other interface, the second flexible printed circuit board 30 defines a hole 36, as shown in FIG. 2E, with a width $W_2$ greater than the width $W_1$ of the first bent portion 52. The hole 36 extends from the predetermined path 33 of FIG. 2C such that the first bent portion 52 and the second bent portion 32 are able to simultaneously pass through the hole 36 of the second flexible printed circuit board 30. As a result, the main body 32b does not interfere with the bent portions 32 and 52. Thus, stress is eliminated at the bent portions 32 and 52, preventing separation of the first flexible printed circuit board 50 from the second flexible printed circuit board 30.

Size and shape of the opening 53 varies with panel thickness, length difference between flexible printed circuit boards, and difference in radii of curvature. The present invention does not limit the size and shape of the opening 53.

Second Embodiment

Figure 3A:
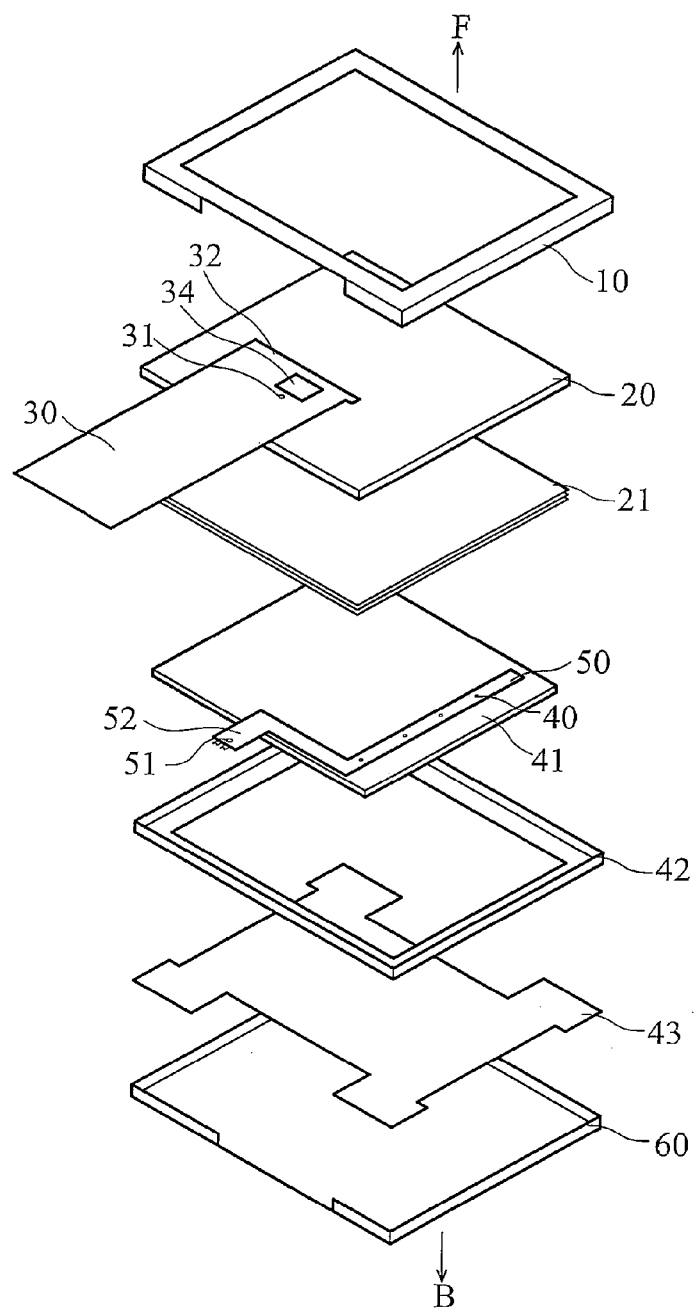
FIG. 3A is a schematic exploded view of an electronic device according to a second embodiment of the present invention.
Figure 3B:
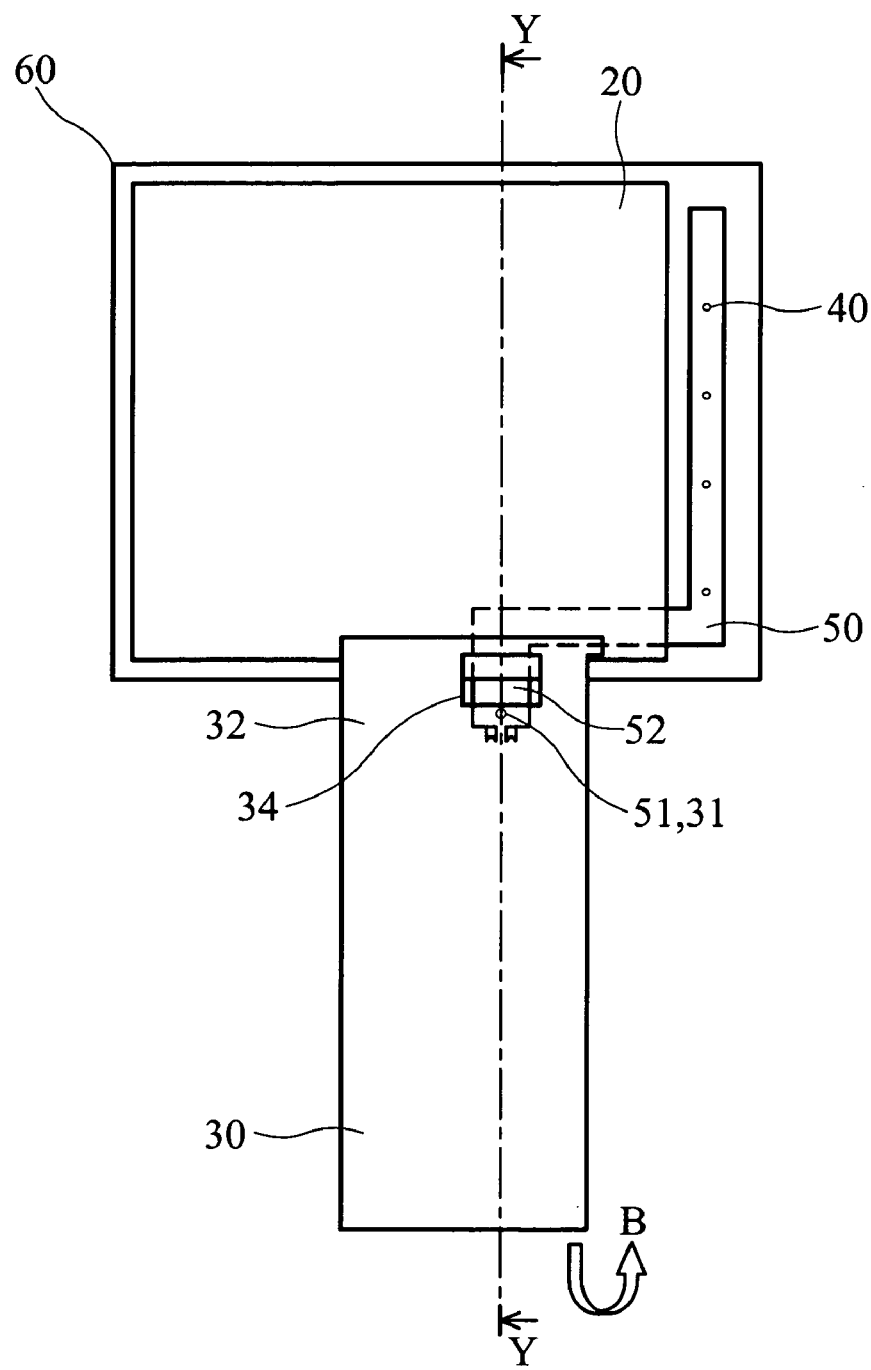
FIG. 3B is a front view of the electronic device according to the second embodiment of the present invention.

FIG. 3A is a schematic exploded view of an electronic device 100 according to a second embodiment of the present invention. FIG. 3B is a front view of the electronic device 100 of the second embodiment. A front bezel 10 and other unrelated elements are omitted to clearly show the connection between the flexible printed circuit boards 30 and 50.

In this embodiment, the elements common to the first embodiment are omitted. The difference is that an opening 34 is defined on the second flexible printed circuit board 30 for the panel 20. Moreover, the first flexible printed circuit board 50 for the light source has no opening. The first and the second flexible printed circuit boards 51 and 31 are connected at the first and the second connection points 51 and 31, as shown in FIG. 3B. The first bent portion 52 is exposed by the opening 34 of the second flexible printed circuit board 30.

Figure 3C:
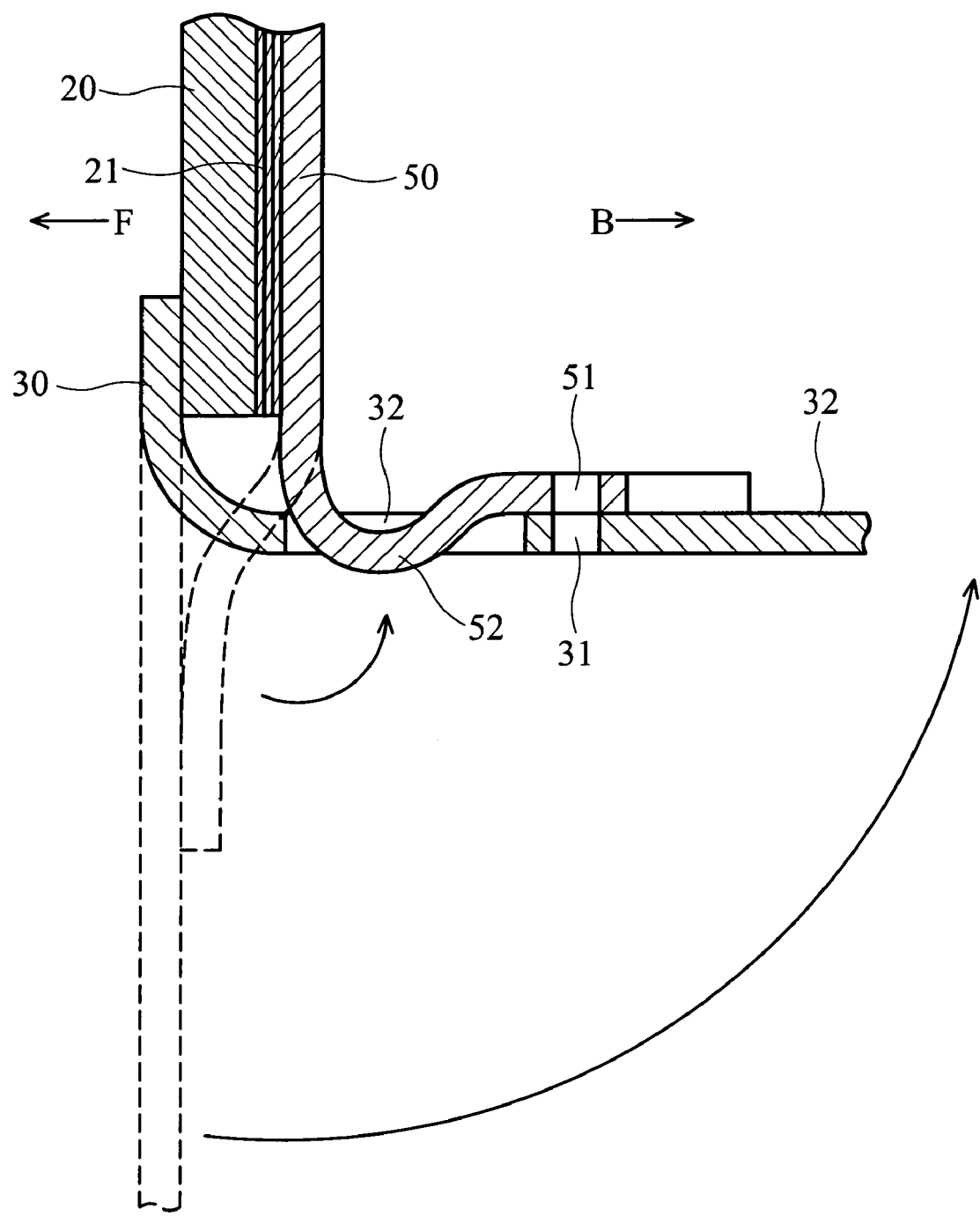
FIG. 3C is a cross section of a panel and two flexible printed circuit boards along line YY of FIG. 3B according to the present invention.

FIG. 3C is a cross section of the panel 20 and two flexible printed circuit boards 30 and 50 along line YY of FIG. 3B according to the present invention. When the first and the second bent portions 52 and 32 are bent 180 degrees to the back of the panel 20, the opening 34 allows the first bent portion 52 to pass through the second bent portion 32. Thus, the first and the second flexible printed circuit boards 50 and 30 do not interfere with each other when bent. Namely, the addition of the opening 34 avoids stress at the bent portions, thereby preventing splits or fractures at welded area.

Size and shape of the opening 34 varies with panel thickness, length difference between flexible printed circuit boards, and difference in radii of curvature. The present invention does not limit the size and shape of the opening 34.

Third Embodiment

Figure 4A:
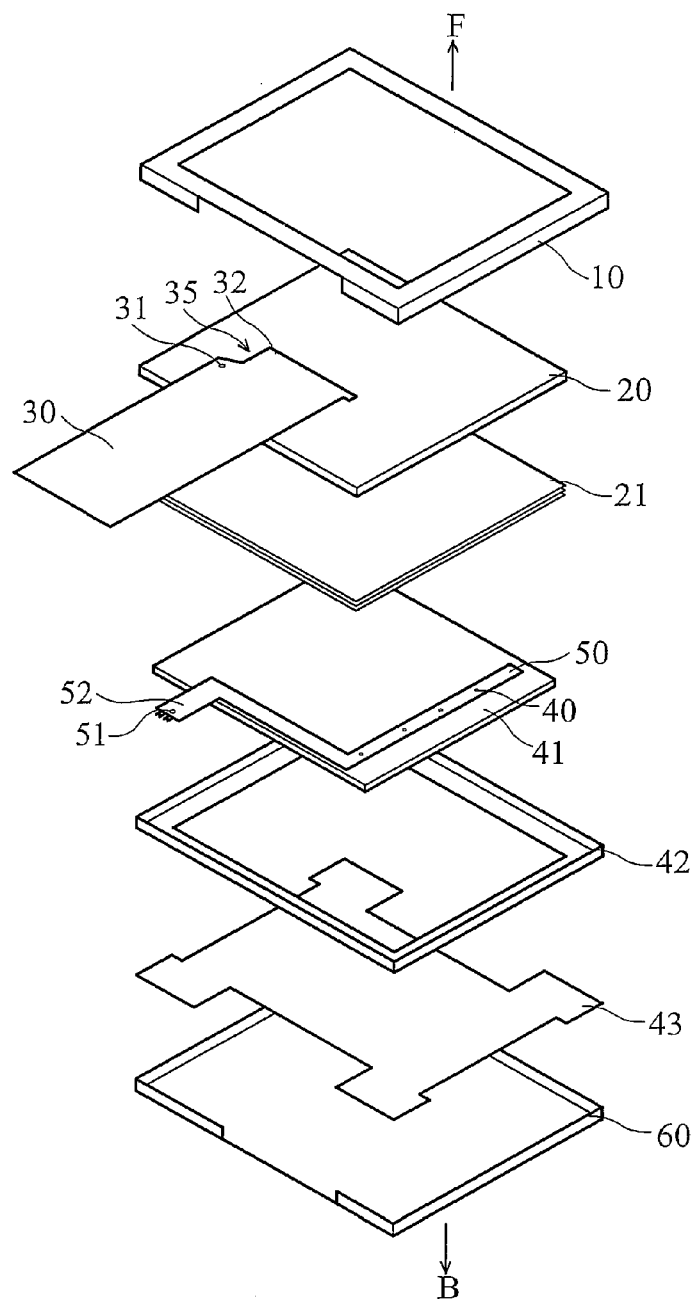
FIG. 4A is a schematic exploded view of an electronic device according to a third embodiment of the present invention.
Figure 4B:
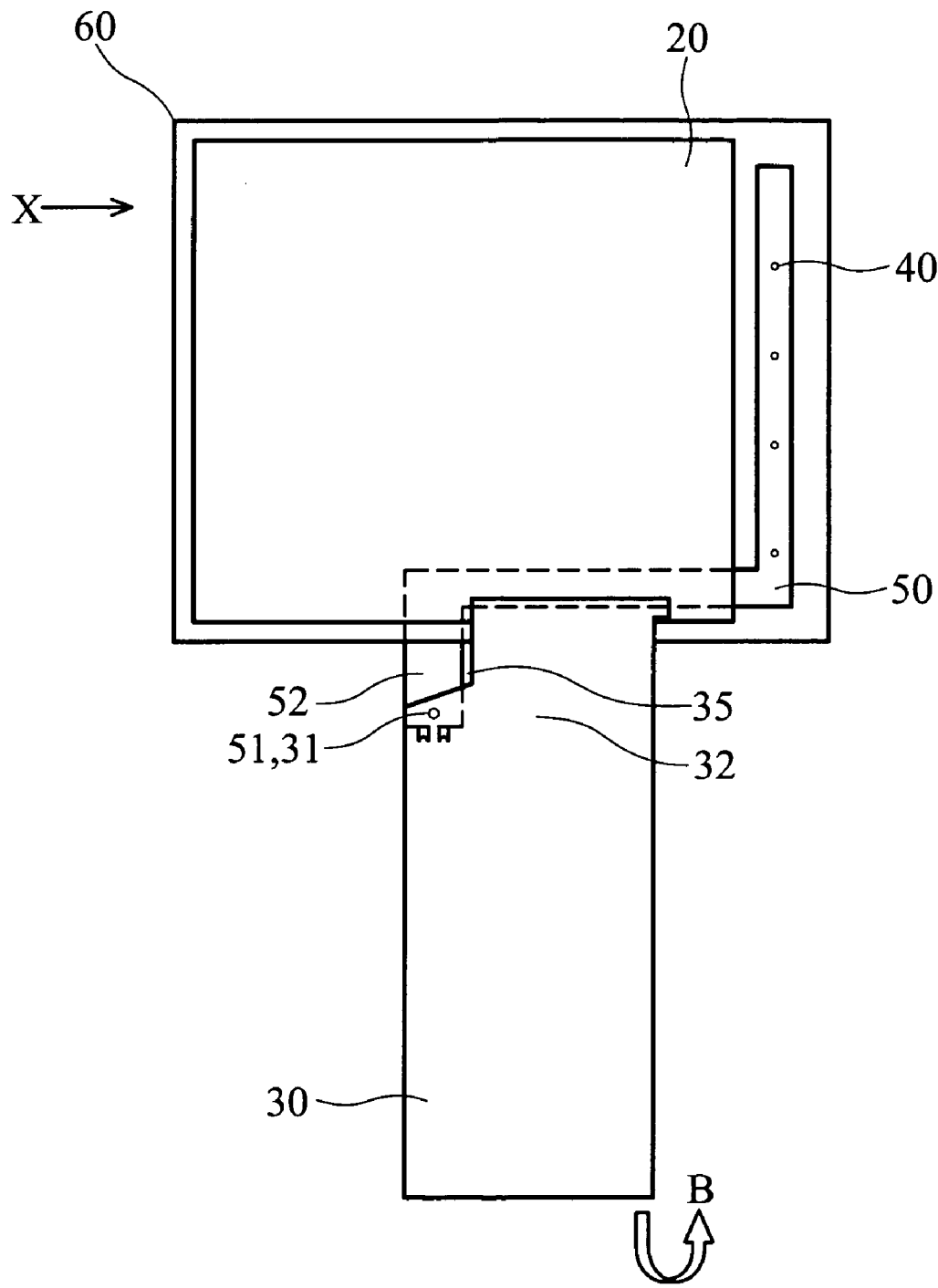
FIG. 4B is a front view of the electronic device according to the third embodiment of the present invention.

FIG. 4A is a schematic exploded view of an electronic device 100 according to a third embodiment of the present invention. FIG. 4B is a front view of the electronic device 100 of the third embodiment. In this embodiment, elements common to the first embodiment are omitted. The difference is that a notch 35 is defined on a periphery of the second flexible printed circuit board 30 for the panel 20. No hole is formed on the first flexible printed circuit board 50.

To engage the first and the second flexible printed circuit boards 50 and 30, the first connection point 51 and the second connection point 31 are welded together. It is noted that since the second connection point 31 is located at the periphery of the second flexible printed circuit board 30, as shown in FIG. 4B, after engagement, the first bent portion 52 is exposed by the notch 35 of the second flexible printed circuit board 30.

Figure 4C:
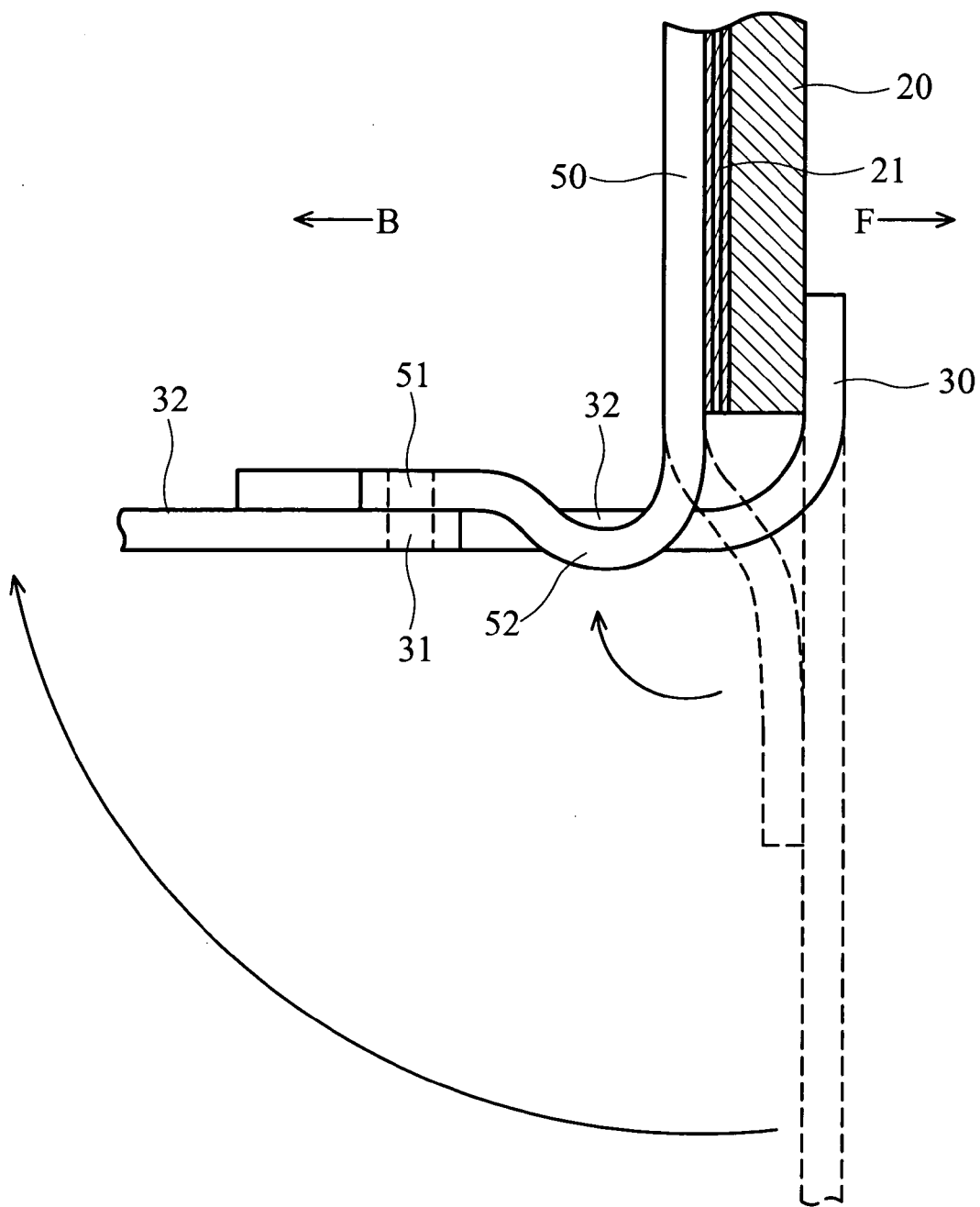
FIG. 4C is a side view of FIG. 4B showing a panel and two flexible printed circuit boards according to the present invention.

FIG. 4C is a side view of FIG. 4B showing the panel 20 and two flexible printed circuit boards 30 and 50 when the first and the second bent portions 52 and 32 are bent 180° to the back of the panel 20.

The notch 52 allows the first bent portion 52 to pass through the second bent portion 32. Thus, the first and the second flexible printed circuit boards 50 and 30 do not interfere with each other. Thus, stress concentration at the connection is reduced.

Size and shape of the notch 35 varies with panel thickness, length difference between flexible printed circuit boards, and difference in radii of curvature. The present invention does not limit the size and shape of the notch 35.

In conclusion, the present invention modifies flexible printed circuit board structures such that when two flexible printed circuit boards are connected by welding and bent 90° or 180°, bent portions are not deformed or separated by stress or strain, increasing speed of assembly and reducing manufacturing costs.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic device for preventing stress concentration and deformation, comprising:
   a first flexible printed circuit board comprising a first bent portion, wherein the first bent portion defines an opening allowing passage of a second bent portion; and
   a second flexible printed circuit board comprising the second bent portion, wherein when the first flexible printed circuit board and the second flexible printed circuit board are simultaneously bent, the second bent portion penetrates the first bent portion.

2. The electronic device as claimed in claim 1, wherein the electronic device is a liquid crystal device.

3. The electronic device as claimed in claim 2, further comprising a panel contacting the first bent portion and a light source contacting the second bent portion.

4. The electronic device as claimed in claim 2, further comprising a panel contacting the second bent portion and a light source contacting the first bent portion.

5. The electronic device as claimed in claim 4, wherein the second bent portion comprises a cantilever, bent and passing through the opening of the first bent portion.

6. The electronic device as claimed in claim 1, wherein the second flexible printed circuit board further defines a hole through which the first bent portion and the second bent portion simultaneously pass.

7. The electronic device as claimed in claim 6, wherein the electronic device is a liquid crystal display comprising a panel, contacting the second flexible printed circuit board.

8. The electronic device as claimed in claim 1, wherein the first bent portion defines a notch allowing passage of the second bent portion therethrough.

9. The electronic device as claimed in claim 8, wherein the electronic device is a liquid crystal display.

10. The electronic device as claimed in claim 9, wherein the liquid crystal display further comprises a panel contacting the first bent portion and a light source contacting the second bent portion.

11. The electronic device as claimed in claim 9, wherein the liquid crystal display further comprises a panel contacting the second bent portion and a light source contacting the first bent portion.

12. The electronic device as claimed in claim 1, wherein the first flexible printed circuit board comprises a first connection point, and the second flexible printed circuit board comprises a second connection point overlapped with the first connection point.

* * * * *